US006534193B2

(12) United States Patent
Sumita et al.

(10) Patent No.: US 6,534,193 B2
(45) Date of Patent: Mar. 18, 2003

(54) LIQUID EPOXY RESIN COMPOSITION AND SEMICONDUCTOR DEVICE

(75) Inventors: Kazuaki Sumita, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/912,400

(22) Filed: Jul. 26, 2001

(65) Prior Publication Data
US 2002/0045709 A1 Apr. 18, 2002

(30) Foreign Application Priority Data
Aug. 1, 2000 (JP) ........................................ 2000-232660

(51) Int. Cl.$^7$ ............................................... H01L 29/12
(52) U.S. Cl. ....................... 428/620; 257/793; 523/423; 523/426; 525/107; 525/108; 525/113
(58) Field of Search ........................... 428/620; 523/434, 523/436; 525/107, 108, 113; 257/793

(56) References Cited

FOREIGN PATENT DOCUMENTS

JP 11012438 * 1/1999

OTHER PUBLICATIONS

Grant, Hachh's Chem. Dictionary, p. 156, 1974.*

* cited by examiner

*Primary Examiner*—Robert Dawson
*Assistant Examiner*—D. Aylward
(74) *Attorney, Agent, or Firm*—Birch, Stewart, Kolasch & Birch, LLP

(57) ABSTRACT

A liquid epoxy resin composition includes (A) a liquid epoxy resin, (B) an optional curing agent, (C) a curing accelerator, (D) an inorganic filler, and (E) an indene-styrene or indene-chroman-styrene copolymer having a Mn of 200–2,000 in an amount of 0.1–20 parts by weight per 100 parts by weight of components (A) and (B) combined. The indene polymer (E) is previously melt mixed with a part or all of the liquid epoxy resin (A) prior to compounding with the remaining components. A semiconductor device sealed with the cured product of the liquid epoxy resin composition remains reliable.

12 Claims, 1 Drawing Sheet

LIQUID EPOXY RESIN COMPOSITION AND SEMICONDUCTOR DEVICE

This invention relates to a liquid epoxy resin composition which cures into a cured product having improved adhesion to the surface of silicon chips and especially photosensitive polyimide resins and nitride films, and a semiconductor device which is sealed with the cured product of the liquid epoxy resin composition.

BACKGROUND OF THE INVENTION

The trend toward smaller sizes, lighter weights and increased capabilities in electrical equipment has led to a shift in the dominant semiconductor mounting process from pin insertion to surface mounting. Progress of semiconductor devices toward a higher degree of integration entails the enlargement of dies having a size as large as 10 mm or more per side. For semiconductor devices using such large size dies, attention is paid to the problems that greater stresses are applied to the die and the sealant during solder reflow, separation occurs at the interface between the sealant and the die or substrate, and the package cracks upon substrate mounting.

Prior art liquid epoxy resin compositions are less adherent to the surface of silicon chips and especially photosensitive polyimide resins and nitride films. In the semiconductor art, there remains a need for improving adhesion to such materials.

SUMMARY OF THE INVENTION

An object of the invention is to provide a liquid epoxy resin composition which cures into a cured product having improved adhesion to the surface of silicon chips and especially photosensitive polyimide resins and nitride films. Another object of the invention is to provide a semiconductor device which is sealed with the cured product of the liquid epoxy resin composition.

The invention addresses a liquid epoxy resin composition comprising a liquid epoxy resin, a curing accelerator, an inorganic filler, and optionally, a curing agent. It has been found that when an indene polymer in the form of a copolymer of indene and styrene and/or a ternary copolymer of indene, chroman and styrene, having a number average molecular weight of 200 to 2,000, is blended in the composition in an amount of 0.1 to 20 parts by weight per 100 parts by weight of the liquid epoxy resin, by previously melt mixing the indene polymer with a part or all of the liquid epoxy resin and then compounding the melt premix with the remaining components, the resulting liquid epoxy resin composition is effectively adherent to the surface of silicon chips and especially photosensitive polyimide resins and nitride films and thus suitable as a sealant for large die size semiconductor devices. Although indene polymers are known as a semiconductor encapsulant to be molded, they have not been used as a component of a liquid epoxy resin composition sealant because they are solid at room temperature. By limiting the amount of the indene polymer and melt premixing it with a liquid epoxy resin, there can be obtained an epoxy resin composition which is liquid at room temperature and which is effectively adherent to the surface of silicon chips and especially photosensitive polyimide resins and nitride films and thus suitable as a sealant for large die size semiconductor devices. The invention is predicated on this finding.

The invention provides a liquid epoxy resin composition comprising (A) a liquid epoxy resin, (B) an optional curing agent, (C) a curing accelerator, (D) an inorganic filler, and (E) an indene polymer. The indene polymer (E) is a copolymer of indene and styrene and/or a ternary copolymer of indene, cumarone, and styrene, having a number average molecular weight of 200 to 2,000, and is present in an amount of 0.1 to 20 parts by weight per 100 parts by weight of component (A) or components (A) and (B) combined. The indene polymer (E) is previously melt mixed with a part of all of the liquid epoxy resin (A) prior to compounding with the remaining components. Also contemplated herein is a semiconductor device which is sealed with the cured product of the liquid epoxy resin composition.

BRIEF DESCRIPTION OF THE DRAWING

The only figure.

DESCRIPTION OF THE PREFERRED EMBODIMENTS

Figure 1:
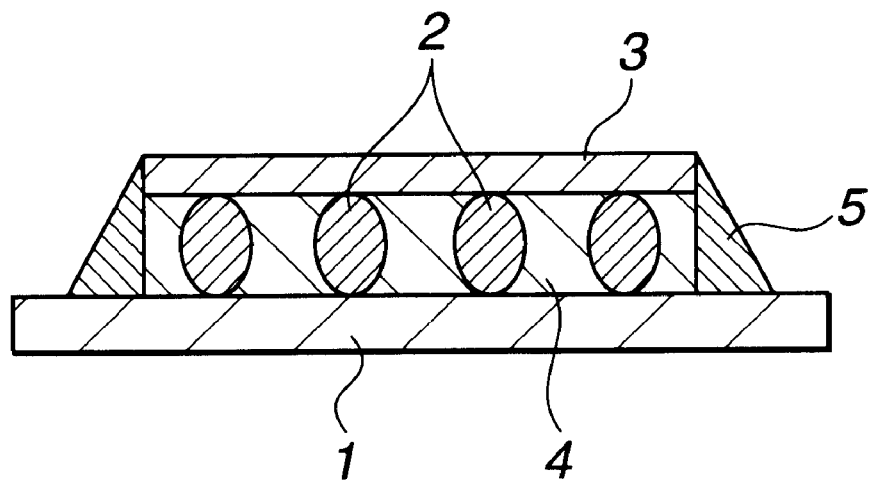
FIG. 1 is a schematic view of a flip chip-type semiconductor device according to one embodiment of the invention.

Component (A) in the liquid epoxy resin composition is a liquid epoxy resin that is not subject to any particular limitations with respect to molecular structure or molecular weight so long as it has at least two epoxy groups per molecule. Illustrative examples include bisphenol-type epoxy resins such as bisphenol A epoxy resin and bisphenol F epoxy resin, novolac-type epoxy resins such as phenolic novolac epoxy resin and cresol novolac epoxy resin, triphenolalkane-type epoxy resins such as triphenolmethane epoxy resin and triphenolpropane epoxy resin, phenolaralkyl-type epoxy resins, biphenylaralkyl-type epoxy resins, stilbene-type epoxy resins, naphthalene-type epoxy resins, biphenyl-type epoxy resins and cyclopentadiene-type epoxy resins. These epoxy resins may be used singly or as mixtures of two or more thereof.

The liquid epoxy resin used in the liquid epoxy resin composition may be any which has at least two epoxy groups per molecule and is liquid at room temperature (e.g., 25° C.). Bisphenol-type epoxy resins such as bisphenol A epoxy resin or bisphenol F epoxy resin are especially preferred. Such epoxy resins may have added thereto epoxy resins of the following structures, provided such addition does not adversely affect penetrability of the composition.

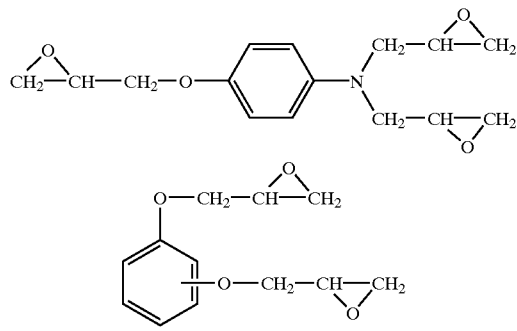

The liquid epoxy resin has a total chlorine content of preferably not more than 1,500 ppm, and especially not more than 1,000 ppm. When chlorine is extracted from the epoxy resin with water at an epoxy resin concentration of 50% and a temperature of 100° C. over a period of 20 hours, the water-extracted chlorine content is preferably not more than 10 ppm. At a total chlorine content of more than 1,500 ppm or a water-extracted chlorine level of more than 10 ppm, the reliability of the sealed semiconductor device, particularly in the presence of moisture, may be compromised.

In the liquid epoxy resin composition of the invention, the liquid epoxy resin (A) can be cured by the curing accelerator (C), obviating the need for a curing agent, in which case the composition becomes an epoxy self-condensing composition. However, if necessary, a curing agent may also be included to effect curing of the composition as, for example, a phenolic resin-curable, acid anhydride-curable or amine-curable composition.

The curing agent (B) is optional in the inventive composition. Any known curing agent may be employed without particular limitation with respect to characteristics such as molecular structure and molecular weight, provided the compound has at least two functional groups capable of reacting with the epoxy groups on the epoxy resin (A), e.g., phenolic hydroxyl groups, amino groups, and acid anhydride groups (at least one acid anhydride group). For example, phenolic resins having at least two phenolic hydroxyl groups per molecule may be used for this purpose. Illustrative examples include novolac-type phenolic resins such as phenolic novolac resin and cresol novolac resin, xylylene-modified novolac resins such as p-xylylene-modified novolac resin, m-xylylene-modified novolac resin and o-xylylene-modified novolac resin, bisphenol-type phenolic resins such as bisphenol A resin and bisphenol F resin, biphenyl-type phenolic resins, resol-type phenolic resins, phenol aralkyl-type resins, biphenyl aralkyl-type resins, triphenolalkane-type resins such as triphenolmethane resin and triphenolpropane resin, and phenolic resins which are polymers of any of the above; as well as naphthalene ring-containing phenolic resins and dicyclopentadiene-modified phenolic resins. Amine-type curing agents and acid anhydride-type curing agents are also useful.

Acid anhydrides are especially advantageous as the curing agent in liquid epoxy resin compositions adapted for use as underfill materials in flip chip-type semiconductor devices. Preferred acid anhydrides include those having on the molecule one or two aliphatic or aromatic ring, one or two acid anhydride groups (e.g., —CO—O—CO—), and about 4 to 25 carbons, and especially about 8 to 20 carbon atoms. Such acid anhydrides are exemplified by tetrahydrophthalic anhydride, methyltetrahydrophthalic anhydride, methylhexahydrophthalic anhydride, hexahydrophthalic anhydride, methylhymic anhydride, pyromellitic dianhydride, 3,4-dimethyl-6-(2-methyl-1-propenyl)-4-cyclohexane-1,2-dicarboxylic acid, 1-methyl-4-(1-methylethyl)-bicyclo-[2.2.2]oct-5-ene-2,3-dicarboxylic acid, maleinized alloocimene, benzophenonetetracarboxylic dianhydride, 3,3',4,4'-biphenyltetracarboxylic dianhydride, bis(3,4-dicarboxyphenyl)ether dianhydride, bis(3,4-dicarboxyphenyl)-methane dianhydride and 2,2-bis(3,4-dicarboxyphenyl)propane dianhydride.

Other curing agents that may be used in the liquid epoxy resin composition of the invention include also carboxylic acid hydrazides such as dicyandiamide, adipic acid hydrazide and isophthalic acid hydrazide.

As already noted, the curing agent (B) is an optional component and need not be included in the liquid epoxy resin composition when the composition is cured as a self-polymerizing (epoxy self-condensing) composition. However, in cases where a curing agent is used to cure the liquid epoxy resin composition, the curing agent should be included in an amount that is effective for curing the epoxy resin. If the curing agent is a phenolic resin, the molar ratio of phenolic hydroxyl groups in the curing agent per mole of epoxy groups on the epoxy resin is preferably from 0.5 to 1.5. Likewise, if the curing agent is an acid anhydride, the molar ratio of carboxyl groups derived from acid anhydride groups (—CO—O—CO—) in the curing agent per mole of epoxy groups on the epoxy resin is preferably from 0.5 to 1.5. At a molar ratio of less than 0.5, the curability may be inadequate. On the other hand, at a molar ratio greater than 1.5, unreacted acid anhydride may remain, possibly lowering the glass transition temperature. A molar ratio within a range of 0.8 to 1.2 is especially preferred. Alternatively, for substantially the same reasons, an acid anhydride curing agent may be incorporated such that the molar ratio of acid anhydride groups in the acid anhydride curing agent per mole of epoxy groups on the epoxy resin is in a range of preferably 0.3 to 0.7, and most preferably 0.4 to 0.6.

In the inventive composition, the curing or reaction accelerator (C) is blended for the purpose of curing the epoxy resin (A) or accelerating curing reaction of the epoxy resin (A) with the curing agent (B). The curing accelerator is not critical as long as it can accelerate curing reaction. For example, one or more compounds selected from among imidazole compounds, tertiary amine compounds and organophosphorus compounds may be used as the curing accelerator.

The imidazole compounds that may be used include those of the following general formula (1).

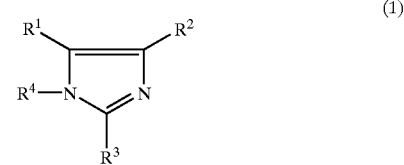

In the formula (1), $R^1$ and $R^2$ are each independently a hydrogen atom or a substituted or unsubstituted monovalent hydrocarbon group of 1 to 12 carbon atoms, examples of which include alkyls, substituted alkyls and aryls such as methyl, ethyl, hydroxymethyl and phenyl. $R^3$ is a substituted or unsubstituted monovalent hydrocarbon group of 1 to 12 carbon atoms, examples of which include alkyls, alkenyls and aryls such as methyl, ethyl, phenyl and allyl. $R^4$ is a hydrogen atom; a substituted or unsubstituted monovalent hydrocarbon group of 1 to 12 carbon atoms, examples of which include alkyls, substituted alkyls and aralkyls such as methyl, ethyl, cyanoethyl and benzyl; or a group of formula (2) below.

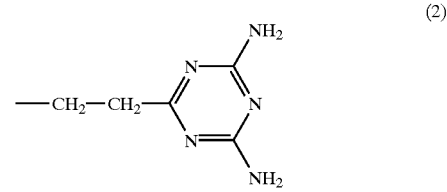

The substituted monovalent hydrocarbon groups mentioned above include hydroxy-substituted and cyano-substituted monovalent hydrocarbon groups.

Examples of suitable imidazole compounds include 2-methylimidazole, 2-ethylimidazole, 2-undecylimidazole, 2,4-dimethylimidazole, 2-heptadecylimidazole, 1,2-dimethylimidazole, 1,2-diethylimidazole, 2-phenyl-4-methylimidazole, 2,4,5-triphenylimidazole, 2-ethyl-4- methylimidazole, 2-phenylimidazole, 1-benzyl-2-phenyl-imidazole, 1-cyanoethyl-2-methylimidazole, 1-cyanoethyl-2-undecylimidazole, 1-benzyl-2-methylimidazole, 2-phenyl-4,5-dihydroxymethylimidazole, 2-aryl-4,5-diphenylimidazoles, 2,4-diamino-6-[2'-methylimidazolyl-(1)']-ethyl-S-triazine, 2,4-diamino-6-[2'-ethyl-4'-methylimidazolyl-(1)']-ethyl-S-triazine, the isocyanuric acid addition product of 2,4-diamino-6-[2'-methylimidazolyl-(1)']-ethyl-S-triazine, and 2-phenyl-4-methyl-5-hydroxymethylimidazole. Of the above imidazole compounds, 2-phenyl-4-methyl-5-hydroxymethylimidazole, 2-phenyl-4,5-dihydroxymethylimidazole, 2,4-diamino-6-[2'-ethyl-4'-methylimidazolyl-(1)']-ethyl-S-triazine, 2-methylimidazole, 2-ethyl-4-methylimidazole, 2-ethylimidazole, 1,2-dimethylimidazole, 1,2-diethylimidazole, 2,4-dimethylimidazole and 2-phenyl-4-methylimidazole are preferred.

Suitable tertiary amine compounds include amine compounds having alkyl or aralkyl substituents bonded to the nitrogen atom, such triethylamine, benzyldimethylamine, benzyltrimethylamine and a-methylbenzyldimethylamine; cycloamidine compounds or organic acid salts thereof, such as 1,8-diazabicyclo[5.4.0]undec-7-ene and its phenol, octanoic acid and oleic acid salts; and salts or complex salts of cycloamidine compounds with quaternary boron compounds, such as the compound of the following formula.

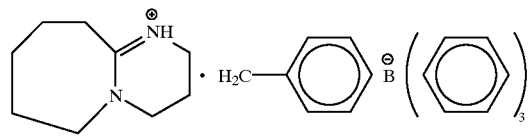

Suitable organophosphorus compounds include triorganophosphines such as triphenylphosphine, tributylphosphine, tri(p-methylphenyl)phosphine, tri(nonylphenyl)phosphine, diphenyltolylphoshine and triphenylphosphine triphenylborane; and quaternary phosphonium salts such as tetraphenylphosphonium tetraphenylborate. Of these, organophosphine compounds of general formula (3) below are preferred.

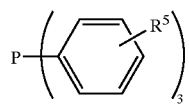

(3)

In formula (3), $R^5$ is a hydrogen atom or an alkyl or alkoxy group of 1 to 4 carbon atoms. Examples of suitable alkyl groups include methyl, ethyl, propyl, isopropyl, butyl, isobutyl and tert-butyl. Examples of suitable alkoxy groups include methoxy and ethoxy. $R^5$ is preferably hydrogen or methyl.

Examples of formula (3) compounds include the following.

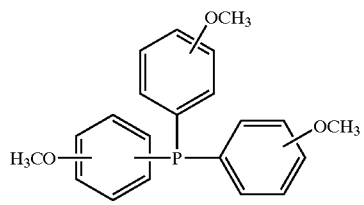

-continued

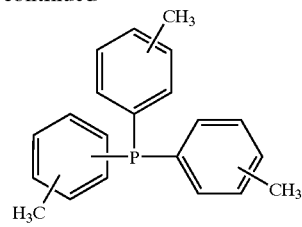

The curing accelerator may be blended as such, but preferably in microcapsule form. Since microcapsules containing the curing accelerator, typically an imidazole compound or an organophosphorus compound are more stable at high temperatures, the epoxy resin composition even loaded with a large amount of an inorganic filler is given a low viscosity enough to penetrate into narrow gaps, by heating the semiconductor device at a high temperature. Then the composition is a sealant which is effective especially as an underfill material in flip chip-type semiconductor devices having large size dies.

The microcapsules employed in the invention use as the shell material a polymer composed of (meth)acrylic monomers such as $C_{1-8}$ alkyl esters of acrylic acid, itaconic acid, methacrylic acid or crotonic acid, or $C_{1-8}$ alkyl esters of the same type in which the alkyl groups have substituents such as allyl groups; monofunctional monomers such as styrene, a-methylstyrene, acrylonitrile, methacrylonitrile or vinyl acetate; and polyfunctional monomers such as ethylene glycol di(meth)acrylate, polyethylene glycol di(meth)acrylate, divinylbenzene, bisphenol A di(meth)acrylate and methylenebis(meth)acrylamide. The imidazole compound and/or organophosphorus compound serving as the catalyst is enclosed within the polymer. Of the above polymers, a polymer of (meth)acrylic monomers is preferred.

A variety of methods may be used to produce the above-described microcapsules containing an imidazole compound and/or organophosphorus compound as the curing catalyst (or curing accelerator). The use of a method known to the art, such as suspension polymerization or emulsion polymerization, is advantageous for the efficient production of microcapsules of good sphericity.

To obtain what would normally be considered a high-concentration microencapsulated catalyst, based on the molecular structure of the catalyst, the above-described monomer is used in an overall amount of preferably about 10 to 200 parts by weight, more preferably 10 to 100 parts by weight, and most preferably 20 to 50 parts by weight, per 10 parts by weight of the curing catalyst. Less than 10 parts by weight of the monomer may be difficult to impart sufficient latency. On the other hand, the use of more than 200 parts by weight of the monomer lowers the proportion of catalyst, which may make it necessary to use a large amount of microencapsulated catalyst to achieve sufficient curability and can therefore be economically undesirable.

The microcapsules produced by the foregoing process typically have an average particle size of 0.5 to 15 $\mu$m, preferably 1 to 10 $\mu$m, and most preferably 2 to 7 $\mu$m. The maximum particle size is preferably no greater than 50 $\mu$m, and most preferably no greater than 20 $\mu$m. At an average particle size of less than 0.5 $\mu$m, the microcapsules may be too small in diameter or too large in specific surface area, the incorporation of a large amount of microcapsules in the composition may increase the viscosity thereof, and the catalyst may have insufficient latency. On the other hand, at an average particle size greater than 15 $\mu$m, dispersion in the resin component may become non-uniform, leading to a decline in the reliability, in addition to which the microcapsules may be so large as to cause gate obstruction during molding.

The microencapsulated catalyst used herein preferably has a performance such that, when 1 g of the curing catalyst-containing microcapsules is measured out and mixed into 30 g of o-cresol, the mixture is left to stand at 30° C. for 15 minutes, and the amount of catalyst that has dissolved out of the microcapsules is determined by gas chromatography, catalyst dissolution from the microcapsules into o-cresol corresponds to at least 70 wt % (i.e., 70 to 100 wt %) of the total amount of catalyst in the microcapsules. At less than 70 wt %, when the semiconductor device is molded using the epoxy resin composition, a molding time of at least 1 minute at 175° C. becomes necessary, which may lower the efficiency of production. A dissolution of at least 75 wt % of the catalyst from the microcapsules is preferred.

The curing catalyst (or curing accelerator) is preferably included within the inventive composition in an amount of from 0.01 to 10 parts by weight, and more preferably 0.5 to 5 parts by weight, per 100 parts by weight of the liquid epoxy resin (A) when no curing agent (B) is included, or per 100 parts by weight of the liquid epoxy resin (A) and the curing agent (B) combined. The use of more than 10 parts by weight of the curing accelerator provides excellent cure, but tends to invite an undesirable loss in shelf stability. Notably the microencapsulated catalyst is preferably included in an amount of 1 to 15 parts, and more preferably 2 to 10 parts by weight per 100 parts by weight of the liquid epoxy resin (A) and the curing agent (B) combined.

As the inorganic filler (D), any inorganic filler known to be useful for lowering the expansion coefficient may be employed. Specific examples include fused silica, crystalline silica, alumina, boron nitride, aluminum nitride, silicon nitride, magnesia and magnesium silicate. Of these, spherical fused silica is desirable for achieving low viscosity and high penetration.

When the liquid epoxy resin composition is used as a potting material, the inorganic filler desirably has an average particle size of 2 to 25 μm, preferably 2 to 20 μm, more preferably 2 to 15 μm and a maximum particle size of preferably up to 75 μm, more preferably up to 50 μm. A filler with an average particle size of less than 2 μm may provide an increased viscosity and cannot be loaded in large amounts. An average particle size of more than 25 μm means the inclusion of a more proportion of coarse particles which will catch on lead wires, causing voids.

The amount of the filler included in the composition is in a range of preferably 100 to 600 parts by weight per 100 parts by weight of the epoxy resin (A) and the optional curing agent (B) combined or per 100 parts by weight of the epoxy resin (A), the optional curing agent (B) and an optional flexibilizer (to be described later) combined. At less than 100 parts by weight, the expansion coefficient tends to be too large, which may cause cracks to form in a thermal cycling test. On the other hand, at more than 600 parts by weight, the viscosity rises, which may bring about a decline in flow.

To obtain a sealant or an encapsulant for underfilling which exhibits both improved penetration and a lower linear expansion, it is advantageous to include a filler having an average particle size at most about one-tenth as large and a maximum particle size at most one-half as large as the size of the gap between the substrate and chip in a flip chip semiconductor device. The amount of such filler included in the sealant is in a range of preferably 100 to 400 parts by weight, and especially 150 to 250 parts by weight, per 100 parts by weight of the epoxy resin (A) and the curing agent (B) combined. At less than 100 parts by weight, the expansion coefficient tends to be too large, which may cause cracks to form in a thermal cycling test. On the other hand, at more than 400 parts by weight, the viscosity rises, which may bring about a decline in the thin-film penetration properties. The inorganic filler typically has a maximum particle size of preferably up to 50 μm, more preferably up to 45 μm, and most preferably up to 30 μm. The average particle size of the filler is generally up to 10 μm, preferably from 0.5 to 10 μm, more preferably from 1 to 5 μm, and most preferably from 1 to 3 μm. The maximum particle size and average particle size may be obtained by particle size distribution measurement involving laser diffraction analysis. The average particle size may be suitably determined as the weight average value, or median diameter.

In the practice of the invention, preliminary surface treatment of the inorganic filler with a coupling agent such as a silane coupling agent or a titanate coupling agent is advantageous for further improving the low moisture absorption, impact resistance and crack resistance of the cured product.

Suitable coupling agents are silane coupling agents including epoxy functional group-bearing alkoxysilanes such as γ-glycidoxypropyltrimethoxysilane, γ-glycidoxypropyl-methyldiethoxysilane and β-(3,4-epoxycyclohexyl)ethyl-trimethoxysilane; amino functional group-bearing alkoxysilanes such as N-β-(aminoethyl)-γ-aminopropyl-trimethoxysilane, γ-aminopropyltriethoxysilane and N-phenyl-γ-aminopropyltrimethoxysilane; and mercapto functional group-bearing alkoxysilanes such as γ-mercaptopropyl-trimethoxysilane. No particular limitation is imposed on the amount of coupling agent and method used in surface treatment.

The an indene polymer (E) is included in the epoxy resin composition of the invention. The indene polymer used herein includes binary copolymers of indene and styrene and ternary copolymers of indene, cumarone, and styrene, has a number average molecular weight of 200 to 2,000, preferably 500 to 1,000, and preferably a softening point of about 90 to 130° C. and a melt viscosity at 150° C. of about 5 to 60 poises, especially about 10 to 50 poises. The preferred indene polymers have the following formulae.

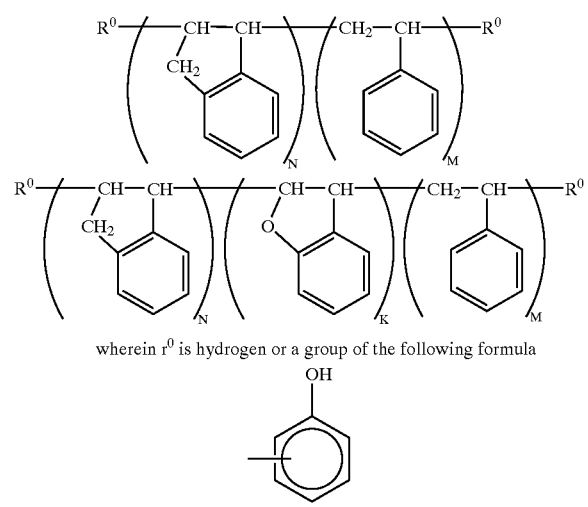

wherein r⁰ is hydrogen or a group of the following formula

K, N and M each are an integer of at least 1, and M+N or K+M+N is such a number as to give a number average molecular weight within the above range.

It is noted that N is at least 30 mol % and M is up to 70 mol % per molecule, that is, based on the sum of M+N or the sum of K+M+N (the same basis is used hereinafter). K is up to 30 mol %. It is desired that N is at least 60 mol %, and more desirably at least 90 mol %. If N is less than 30 mol %, no satisfactory adhesion may be achievable. For improved adhesion, N should be at least 60 mol %. The preferred melt viscosity is in the range of 10 to 50 poises at 150° C.

These indene polymers are commercially available, for example, under the trade name of IP series such as indene oligomer IP-100 from Nippon Steel Chemical Co., Ltd.

An appropriate amount of the indene polymer added is 0.1 to 20 parts, and desirably 0.5 to 10 parts by weight per 100 parts by weight of the liquid epoxy resin (A) and the optional curing agent (B) combined. Less than 0.1 part of the indene polymer is ineffective for improving adhesion whereas inclusion of more than 20 parts of the indene polymer results in a lower crosslinking density and an insufficient strength.

The indene polymer (E) is previously melt mixed with a part or all of the liquid epoxy resin (A) before the premix is compounded with the remaining components. The melt mixing method includes blending appropriate proportions of the liquid epoxy resin and the indene polymer and mixing them while heating at a temperature in the range of 80 to 150° C. Any of well-known mixers and kneaders may be used in melt mixing.

The composition of the invention may include also a flexibilizer to lower stress. Suitable examples include silicone rubbers, silicone oils, liquid polybutadiene rubbers, and thermoplastic resins such as methyl methacrylate-butadiene-styrene copolymers. Preferably, the flexibilizer is a copolymer of an epoxy resin or phenolic resin with an organopolysiloxane, more specifically a copolymer prepared by the addition reaction of the alkenyl groups within an alkenyl group-bearing epoxy resin or phenolic resin with the SiH groups (that is, hydrogen atoms bonded to silicon atoms) in an organohydrogenpolysiloxane of formula (4) below having 20 to 400, and preferably 40 to 200, silicon atoms and having 1 to 5, preferably 2 to 4, and most preferably 2, SiH groups per molecule.

$$H_a R_b SiO_{(4-a-b)/2} \quad (4)$$

In formula (4), R is a substituted or unsubstituted monovalent hydrocarbon group, "a" is a positive number from 0.002 to 0.1, "b" is a positive number from 1.8 to 2.2, and the sum a+b is from 1.81 to 2.3.

The monovalent hydrocarbon group represented by R preferably has 1 to 10 carbons, and especially 1 to 8 carbons. Illustrative examples include alkyl groups such as methyl, ethyl, propyl, isopropyl, butyl, isobutyl, tert-butyl, hexyl, cyclohexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halogenated monovalent hydrocarbon groups in which some or all of the hydrogen atoms on the hydrocarbon groups have been substituted with halogen atoms (e.g., chlorine, fluorine, bromine), such as chloromethyl, bromoethyl and trifluoropropyl.

Copolymers having one of the following structures are preferred.

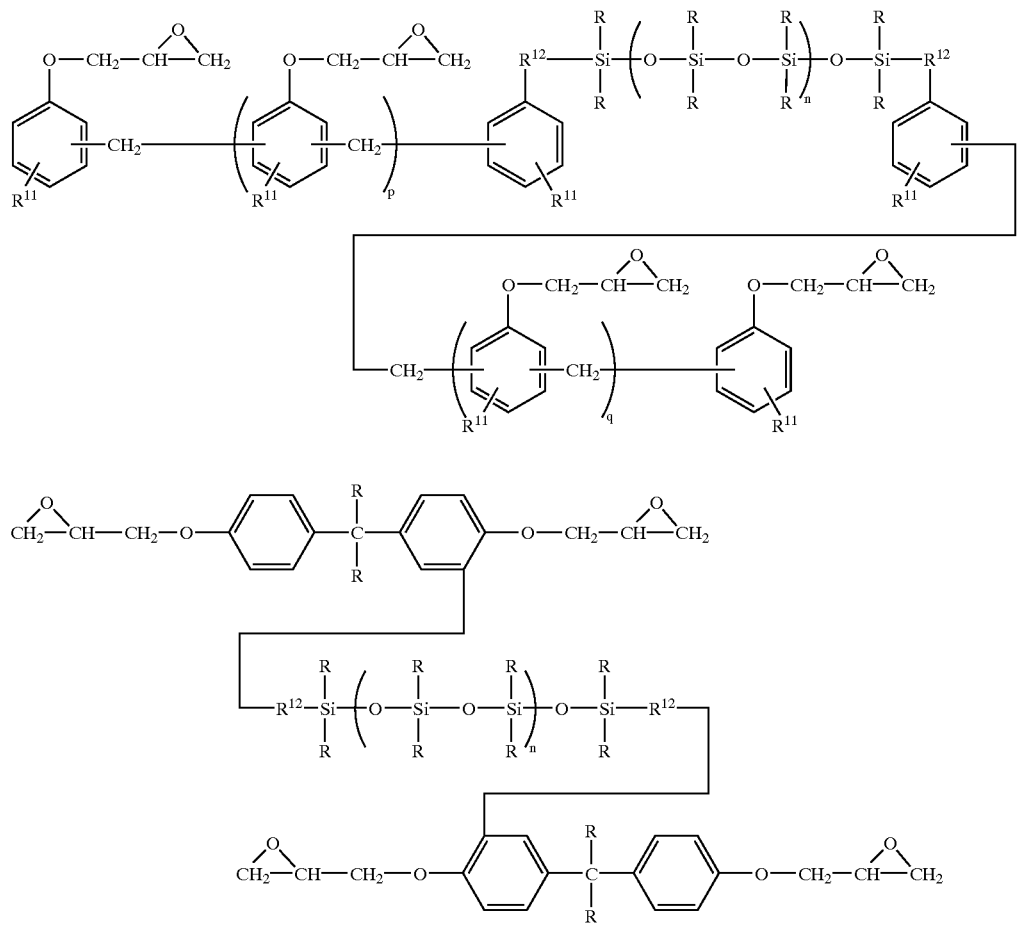

In the above formulas, R is as defined above, $R^{11}$ is a hydrogen atom or an alkyl of 1 to 4 carbons, and $R^{12}$ is —CH₂CH₂CH₂—, —OCH₂—CH(OH)—CH₂—O—CH₂CH₂CH₂— or —O—CH₂CH₂CH₂—. The letter n is an integer from 4 to 199, and preferably from 19 to 99, p is an integer from 1 to 10, and q is an integer from 1 to 10.

The above-described copolymer is included in the inventive composition such that the amount of diorganopolysiloxane units is 0 to 20 parts by weight, and preferably 2 to 15 parts by weight, per 100 parts by weight of the liquid epoxy resin (A) and the curing agent (B) combined, whereby stress can be further reduced.

If necessary, the liquid epoxy resin composition may contain also other additives as long as they do not compromise the objects of the invention. Suitable additives include carbon-functional silanes for improving adhesion, antioxidants, waxes, pigments such as carbon black, colorants such as organic dyes, ion trapping agents, surfactants, and flame retardants such as brominated resins and antimony.

The liquid epoxy resin composition of the invention may be prepared by the simultaneous or discrete stirring, melting, mixing or dispersion of the epoxy resin, curing accelerator and inorganic filler as well as optional components such as curing agent and flexibilizer, while carrying out heat treatment if necessary. Prior to this compounding step, the indene polymer is melt premixed with a portion or all of the epoxy resin as described above. No particular limitation is imposed on the apparatus used for mixing, stirring, dispersing and otherwise processing the mixture of components. Exemplary apparatus suitable for this purpose include an automated mortar, three-roll mill, ball mill and planetary mixer which is equipped with an agitator and a heater. Use can also be made of suitable combinations of these apparatuses.

Preferably the liquid epoxy resin composition has a viscosity of less than about 10,000 poises at 25° C.

An ordinary molding method and ordinary molding conditions may be employed when sealing semiconductor devices with the inventive composition. It is preferable to carry out an initial hot oven cure at about 100 to 120° C. for at least about ½ hour, followed by a subsequent hot oven cure at about 150° C. for at least about ½ hour. Initial curing conditions below the above-mentioned temperature and time may result in void formation after curing, and subsequent curing conditions below the temperature and time indicated above may yield a cured product having less than sufficient properties.

The semiconductor devices to be sealed with the inventive composition are typically flip chip-type semiconductor devices. Referring to FIG. 1, the flip chip-type semiconductor device includes an organic substrate 1 having an interconnect pattern side on which is mounted a semiconductor chip 3 over a plurality of intervening bumps 2. The gap between the organic substrate 1 and the semiconductor chip 3 (shown in the diagram as gaps between the bumps 2) is filled with an underfill material 4, and the lateral edges of the gap are sealed with a fillet material 5. The inventive composition is especially suitable in forming the underfill. When the inventive composition is used as an underfill material, the cured product preferably has an expansion coefficient of 20 to 40 ppm/° C. below the glass transition temperature. Sealant used as the fillet material may be a conventional material known to the art. The use as the fillet of a liquid epoxy resin composition of the same general type as that described above is especially preferred, although the cured product in this case preferably has an expansion coefficient of 10 to 20 ppm/° C. below the glass transition temperature.

EXAMPLES

Examples of the invention and comparative examples are given below by way of illustration, and are not intended to limit the invention.

Examples 1 to 4 and Comparative Examples 1 to 4

The components shown in Table 1 were blended to uniformity on a three-roll mill to give eight epoxy resin compositions. These epoxy resin compositions were examined by the following tests. The results are also shown in Table 1.

Viscosity

The viscosity at 25° C. was measured using a BH-type rotary viscometer at a rotational speed of 4 rpm.

Gelation Time

The gelation time for the composition was measured on a 150° C. hot plate.

Glass Transition Temperature (Tg)

Using a sample of cured material measuring 5×5×15 mm, the glass transition temperature was measured with a thermomechanical analyzer at a heating rate of 5° C./min.

Coefficients of Thermal Expansion

In the measurement of the glass transition temperature described above, the coefficient of thermal expansion below the glass transition temperature (CTE-1) was determined for a temperature range of 50 to 80° C., and the coefficient of thermal expansion above the glass transition temperature (CTE-2) was determined for a temperature range of 200 to 230° C.

Adhesion Test

On a silicon chip coated with photosensitive polyimide, the composition was molded and cured at 150° C. for 3 hours to form a frustoconical test piece having a top diameter of 2 mm, a bottom diameter of 5 mm and a height of 3 mm. After curing, the test piece was measured for shear bond strength (initial). The test piece was held in a pressure cooker test (PCT) environment of 121° C. and 2.1 atm. where the test piece was moistened for 168 hours. After moistening, the test piece was measured for shear bond strength again. In each example, five test pieces were used and the bond strength reported was an average thereof.

PCT Delamination Test

A polyimide-coated 10×10 mm silicon chip was stacked on a 30×30 mm FR-4 substrate using spacers of approximately 100 μm thick, leaving a gap therebetween. An epoxy resin composition as underfill material was introduced into the gap and cured. The assembly was then placed in a pressure cooker test (PCT) environment of 121° C. and 2.1 atm for 168 hours. At the end of the test, the assembly was checked for delamination by C-SAM.

TABLE 1

| | Example | | | | Comparative Example | | | |
|---|---|---|---|---|---|---|---|---|
| Component (pbw) | 1 | 2 | 3 | 4 | 1 | 2 | 3 | 4 |
| RE410 | 43 | 43 | 29 | 85 | 50 | 50 | 100 | |
| MH700 | 50 | 50 | 50 | | 50 | 50 | | 50 |
| SE8FC | 200 | 200 | 200 | 150 | 200 | 200 | 150 | 200 |
| KBM403 | 1.0 | 1.0 | 1.0 | 1.0 | 1.0 | 1.0 | 1.0 | 1.0 |

TABLE 1-continued

| Component (pbw) | Example | | | | Comparative Example | | | |
|---|---|---|---|---|---|---|---|---|
| | 1 | 2 | 3 | 4 | 1 | 2 | 3 | 4 |
| Copolymer | 2 | 2 | 2 | 2 | 2 | 2 | 2 | 2 |
| Microencapsulated catalyst of 2E4MZ | 10 | | 10 | | 10 | | | |
| 2E4MZ | | 5 | | | | 5 | | 5 |
| 2P4MHZ-PW | | | | 3 | | | 3 | |
| IP-100/RE410 (3/7) premix | 10 | 10 | 30 | 15 | | 0.09 | | 70 |
| Viscosity at 25° C. (Pa · s) | 510 | 630 | 780 | 360 | 410 | 490 | 330 | 1220 |
| Gelation time at 150° C. (s) | 78 | 58 | 78 | 85 | 74 | 60 | 83 | 85 |
| Tg (° C.) | 140 | 142 | 138 | 137 | 142 | 141 | 138 | 123 |
| CTE-1 (ppm/° C.) | 26 | 25 | 27 | 32 | 25 | 26 | 32 | 34 |
| CTE-2 (ppm/° C.) | 82 | 82 | 84 | 90 | 81 | 84 | 92 | 113 |
| PCT delamination test | no delamination | no delamination | no delamination | no delamination | delaminated | delaminated | delaminated | delaminated |
| Bond strength (kgf/cm$^2$) | | | | | | | | |
| Initial | 108 | 102 | 105 | 100 | 98 | 102 | 104 | 88 |
| After 168 hr PCT | 98 | 87 | 68 | 106 | 0 | 15 | 38 | 89 |

Components:
RE410: bisphenol A-type epoxy resin (Nippon Kayaku Co., Ltd.)
MH700: methyltetrahydrophthalic anhydride (New Japan Chemical Co., Ltd.)
SE8FC: spherical silica (Tokuyama Soda Co., Ltd.); maximum particle size ≦25 μm, average particle size 8 μm
KBM403: silane coupling agent γ-glycidoxypropyltrimethoxy-silane (Shin-Etsu Chemical Co., Ltd.)
2P4MHZ-PW: 2-phenyl-4-methyl-5-hydroxymethylimidazole (Shikoku Chemical Corp.); average particle size 3.8 μm and maximum particle size 15 μm
2E4MZ: 2-ethyl-4-methylimidazole (Shikoku Chemical Corp.) Microencapsulated catalyst of 2E4MZ: A methyl methacrylate polymer which contains 20 wt % of 2E4MZ. Average particle size, 7 μm. Amount of catalyst which dissolves from microcapsules during 15 minutes of treatment in o-cresol at 30° C., 87 wt %.
Copolymer: the addition reaction product of

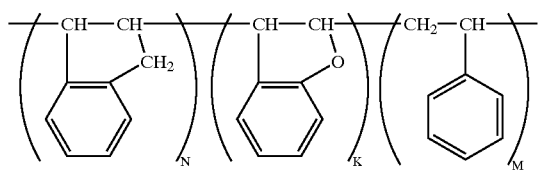

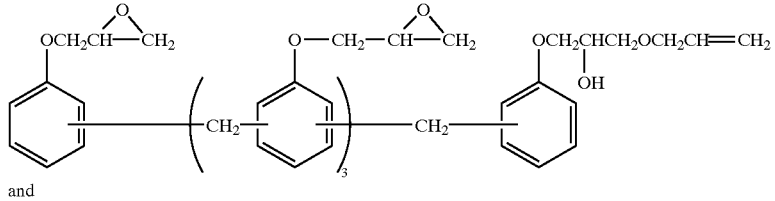

and

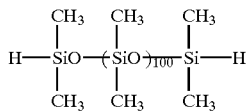

IP-130: ternary copolymer of indene-cumarone-styrene (Nippon Steel Chemical Co., Ltd.)

K, M and N are positive integers, softening point 102° C., melt viscosity 8 poises at 150° C. Note that "IP-100/RE410 (3/7) premix" means a premix of previously melt mixed IP-100 and RE410 in a weight ratio of 3/7.

There has been described a liquid epoxy resin composition which cures into a cured product having improved adhesion to the surface of silicon chips and especially to photosensitive polyimide resins and nitride films and is thus best suited as a sealant for semiconductor devices having large size dies and especially of the flip chip type. These characteristics confer a very high reliability to semiconductor devices sealed with the inventive epoxy resin composition.

Japanese Patent Application No. 2000-232660 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A liquid epoxy resin composition comprising
   (A) a liquid epoxy resin,
   (C) a microencapsulated catalyst containing an imidazole compound or an organophosphorus compound of both, having an average particle size of 0.5 to 15 μm, and having a catalyst dissolution from the microcapsules into o-cresol, as measured at 30° C. over a period of 15 minutes, which corresponds to at least 70% by weight of the total amount of catalyst in the microcapsules,
   (D) an inorganic filler, and
   (E) 0.1 to 20 parts by weight of an indene polymer per 100 parts by weight of the liquid epoxy resin (A), the indene polymer being a copolymer of indene and styrene or a ternary copolymer of indene, cumarone, and styrene or both, having a number average molecular weight of 200 to 2,000,
   the indene polymer (E) being previously melt mixed with a part of all of the liquid epoxy resin (A) prior to compounding with the remaining components.

2. The composition of claim 1 wherein the imidazole compound is selected from the group consisting of 2-methylimidazole, 2-ethylimidazole, 1,2-dimethylimidazole, 2-undecylimidazole, 2-heptadecylimidazole, 2-phenylimidazole, 1-benzyl-2-methylimidazole, 1-benzyl-2-phenylimidazole, 1-cyanoethyl-2-undecylimidazole, 1-benzyl-2-methylimidazole, 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamino-6-[2'-undecylimidazolyl]-ethyl-S-triazine, 2-phenyl-4-methyl-5-hydroxymethylimidazole, 2-phenyl-4,5-dihydroxymethylimidazole, and 2-aryl-4,5-diphenylimidazole.

3. The composition of claim 1 wherein the imidazole compound is selected form the group consisting of 2-ethyl-4-methylimidazole, 2-undecylimidazole, 2-phenyl-4-methyl-5-hydroxymethylimidazole, and 2-phenyl-4,5-dihydroxymethylimidazole.

4. A semiconductor device, wherein said device is sealed with the cured product of the liquid epoxy resin composition of claim 1.

5. The semiconductor device of claim 4, which is of the flip chip type.

6. A liquid epoxy resin composition comprising
   (A) a liquid epoxy resin,
   (B) a curing agent,
   (C) a microencapsulated catalyst containing an imidazole compound or an organophosphorus compound of both, having an average particle size of 0.5 to 15 μm, and having a catalyst dissolution from the microcapsules into o-cresol, as measured at 30° C. over a period of 15 minutes, which corresponds to at least 70% by weight of the total amount of catalyst in the microcapsules,
   (D) an inorganic filler, and
   (E) 0.1 to 20 parts by weight of an indene polymer per 100 parts by weight of the liquid epoxy resin (A), the indene polymer being a copolymer of indene and styrene or a ternary copolymer of indene, cumarone, and styrene or both, having a number average molecular weight of 200 to 2,000,
   the indene polymer (E) being previously melt mixed with a part of all of the liquid epoxy resin (A) prior to compounding with the remaining components.

7. The composition of claim 6 wherein the imidazole compound is selected from the group consisting of 2-methylimidazole, 2-ethylimidazole, 1,2-dimethylimidazole, 2-undecylimidazole, 2-heptadecylimidazole, 2-phenylimidazole, 1-benzyl-2-methylimidazole, 1-benzyl-2-phenylimidazole, 1-cyanoethyl-2-undecylimidazole, 1-benzyl-2-methylimidazole, 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamino-6-[2'-undecylimidazolyl]-ethyl-S-triazine, 2-phenyl-4-methyl-5-hydroxymethylimidazole, 2-phenyl-4,5-dihydroxymethylimidazole, and 2-aryl-4,5-diphenylimidazole.

8. The composition of claim 6 wherein the imidazole compound is selected form the group consisting of 2-ethyl-4-methylimidazole, 2-undecylimidazole, 2-phenyl-4-methyl-5-hydroxymethylimidazole, and 2-phenyl-4,5-dihydroxymethylimidazole.

9. A semiconductor device, wherein said device is sealed with the cured product of the liquid epoxy resin composition of claim 6.

10. The semiconductor device of claim 9, which is of the flip chip type.

11. The composition of claim 1, wherein said indene polymer is a ternary copolymer of indene-cumarone-styrene having the formula

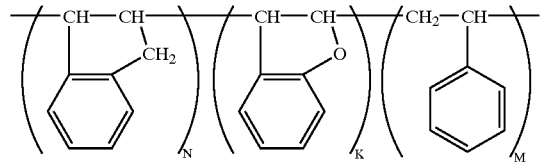

in which K, M, and N are positive integers and the copolymer has a softening point of 102° C. and a melt viscosity of 8 poises at 150° C.

12. The composition of claim 6, wherein said indene polymer is a ternary copolymer of indene-cumarone-styrene having the formula

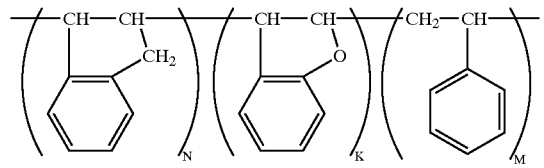

in which K, M, and N are positive integers and the copolymer has a softening point of 102° C. and a melt viscosity of 8 poises at 150° C.

* * * * *